(12) United States Patent
Quesnel

(10) Patent No.: US 7,927,765 B2
(45) Date of Patent: Apr. 19, 2011

(54) ADJUSTABLE MASK BLANK STRUCTURE FOR AN EUV PHASE-SHIFT MASK

(75) Inventor: Etienne Quesnel, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 264 days.

(21) Appl. No.: 11/911,884

(22) PCT Filed: Apr. 24, 2006

(86) PCT No.: PCT/FR2006/050380
§ 371 (c)(1),
(2), (4) Date: Oct. 18, 2007

(87) PCT Pub. No.: WO2006/114544
PCT Pub. Date: Nov. 2, 2006

(65) Prior Publication Data
US 2009/0130569 A1  May 21, 2009

(30) Foreign Application Priority Data
Apr. 26, 2005 (FR) ...................................... 05 51078

(51) Int. Cl.
*G03F 1/00* (2006.01)
(52) U.S. Cl. .......................................................... 430/5
(58) Field of Classification Search .................. 430/5
See application file for complete search history.

(56) References Cited

U.S. PATENT DOCUMENTS

| | | | | |
|---|---|---|---|---|
| 4,522,842 A | * | 6/1985 | Levinstein et al. | 427/8 |
| 6,489,066 B2 | * | 12/2002 | Mirkanimi | 430/5 |
| 6,645,679 B1 | | 11/2003 | La Fontaine et al. | |
| 2003/0031937 A1 | | 2/2003 | Yan | |
| 2003/0031938 A1 | | 2/2003 | Singh et al. | |
| 2003/0091910 A1 | | 5/2003 | Schwarzl et al. | |
| 2004/0062999 A1 | | 4/2004 | Stearns et al. | |
| 2004/0091789 A1 | | 5/2004 | Han et al. | |
| 2004/0121134 A1 | * | 6/2004 | Bijkerk et al. | 428/212 |
| 2004/0188383 A1 | * | 9/2004 | Lucas et al. | 216/54 |

FOREIGN PATENT DOCUMENTS

EP  0 660 184 A2  6/1995

OTHER PUBLICATIONS

Torsten Feigl, et al. "Damage Resistant and Low Stress EUV Multilayer Mirrors" Japanese Journal of Applied Physics, The Japan Society of Applied Physics, vol. 41, Part 1, No. 6B, 2002, pp. 4082-4085.
Stefan Braun, et al. "Mo/Si Multilayers with Different barrier Layers for Applications as Extreme Ultraviolet Mirrors" Japanese Journal of Applied Physics, The Japan Society of Applied Physics, vol. 41, Part 1, No. 6B, Jun. 2002, pp. 4074-4081.
Sergiy Yulin, et al. "MuP09: High-temperature $MoSi_2$/Si and Mo/C/Si/C multilayer mirrors" 3$^{rd}$ International EUVL Symposium, Nov. 1-4, 2004, Miyazaki, Japan, 1 Page.

* cited by examiner

*Primary Examiner* — Stephen Rosasco
*Assistant Examiner* — Jonathan Jelsma
(74) *Attorney, Agent, or Firm* — Oblon, Spivak, McClelland, Maier & Neustadt, L.L.P.

(57) ABSTRACT

The invention concerns a process for forming an optical component comprising:
a—formation of a multi-layer stack (32, 34) with an adjustment layer (30) made of a metal-semiconductor mix formed in or on the stack,
b—etching a part of the multi-layer stack, including at least a part of the adjustment layer,
c—an annealing step to contract the adjustment layer within less than 1 nm.

20 Claims, 7 Drawing Sheets

ADJUSTABLE MASK BLANK STRUCTURE FOR AN EUV PHASE-SHIFT MASK

TECHNICAL DOMAIN AND PRIOR ART

The invention relates to the domain of optical components, and particularly but not uniquely, mask blanks and lithography masks for microelectronic application, for example EUV masks operating in reflection or phase shift masks.

The spectral application domain is preferably the Extreme Ultra-Violet (EUV: $\lambda$=10-30 nm).

One example of an application domain is EUV lithography in microelectronics.

The invention also relates to EUV optical functions requiring a fine adjustment of the thickness of the optical structure within a variation range between 1 Å and a few nanometers.

In general, in the domain of lithography masks, the size of patterns to be printed on the silicon wafer is reduced firstly by reducing the insulation wavelengths, and secondly by optimisation of the optical structure of masks.

In principle, the objective is to project increasingly small patterns on the resin covering the silicon wafer, with contours as well defined as possible.

The purpose is to obtain etched resin profiles with edges with low roughness and sides with well controlled slopes, once the exposed resins zones have been developed.

The projection of the patterns, the control of their shape and their position on the silicon wafer are achieved by placing a mask between the insolation light source and the wafer to be insolated.

Thus, better control of etching profiles is obtained particularly through the use of particular masks called Phase Shift Masks (PSM). These masks also make it possible to obtain a very small minimum pattern sizes (resolution), equivalent to half of the insolation wavelength.

In the EUV lithography domain, the reduction of patterns to a size of 22 nm or even less imposes the use of such phase shift masks.

The principle of a classical EUV mask is to project the pattern to be insolated by reflection rather than by transmission, as in visible and UV lithography.

To achieve this, the surface structure of the mask consists of delimiting reflecting and absorbing zones on its surface, as illustrated in FIG. 1.

On this figure, references 10 and 12 denote a protection layer and a buffer layer respectively, and reference 8 denotes an absorbent layer. A multi-layer mirror 4 is formed on a substrate 6.

Incident radiation 11 is broken down into a reflected part 13 and a part 15 for which the intensity is attenuated with respect to part 13 due to absorption by the layer 8.

The reflecting surface then corresponds to the pattern to be insolated on the resin, except for the magnification factor.

In reflecting zones, the mirror function is achieved by the multi-layer coating 4 composed of a periodic stack of Mo/Si bilayers (typically 40 bilayers, each bilayer comprising a 2.8 nm layer of Mo and a 4.1 nm layer of Si, for a required wavelength of 13.4 nm). Therefore, print areas (patterns) are created and delimited by modulation of the optical reflection of the surface depending on whether or not the absorbent layer 8 is present.

In the case of an EUV mask used for very small patterns, (22 nm), patterns to be printed are delimited by modulation of the reflected signal phase, for example by structuring the surface by multi-layer etching 4, 4-1 (see FIG. 2).

The phase shift $\Delta\Phi$ introduced between the etched and unetched zones, in other words between the reflections R1 and R2, depends on the difference in the optical step and therefore the etched thickness $\Delta\epsilon$ of the multi-layer. The objective is to guarantee sufficiently high contrast at the passage over the step (passage R1=>R2). Schematically, it is considered that the contrast depends on the difference of $\Delta\Phi$ with respect to 180°. In other words, it is maximum when $\Delta\Phi$ is equal to exactly 180°.

Current lithography specifications impose at least a certain contrast to guarantee correct etching profile of the resin. This constraint is equivalent to guaranteeing a phase shift of signals R1 and R2 equal to $\Delta\Phi$=180±5°, namely a precision on the etching depth $\Delta\epsilon$ equal to ±1 Å.

This precision is due to the linear relation between the phase shift $\Delta\Phi$ and the etching depth $\Delta\epsilon$. FIG. 3 shows an example of a phase shift calculation in the case of a periodic multi-layer Mo/Si. It can be seen that the phase shift is equal to 180° after etching 19 to 20 Mo/Si pairs.

Technologically, control over etching to within ±1 Å is very difficult. It requires not only knowing how to stop etching with extremely good precision but also to have perfect control over etching homogeneity. At the present time, current precisions achieved in term of etching are of the order of ±1 nm. To achieve this, and to facilitate stopping etching, a stop layer 20 is usually inserted in the stack (see FIG. 4), between portions 4 and 4-1 of the multi-layer used. This layer 20 is optically neutral (thickness: modulo $\lambda/2n$, where n is the optical index of the stop layer) and it has good selectivity of etching with respect to the stack.

Finally, another variant of PSM EUV masks consists of adding an absorbent layer 26 on the multi-layer (FIG. 5) to reduce R1. This type of mask is known as an attenuated phase shift mask.

Therefore the problem that arises is to control step thicknesses for manufacturing of optical components, and particularly phase shift EUV masks, to within an Angstrom.

PRESENTATION OF THE INVENTION

The invention discloses an optical component structure, and particularly a mask, for example such as a phase shift mask in the EUV and an associated manufacturing process capable of adjusting the phase shift $\Delta\Phi$ to within ±5° after etching, namely the geometric step difference $\Delta\epsilon$ with good precision less than a few fractions of nm and preferably of the order of ±1 Å.

The invention relates firstly to a method of forming an optical component comprising:

a—formation of a multi-layer stack with an adjustment layer made of a metal-semiconductor mix formed in or on the stack, this mix possibly being formed after annealing an alloy, b—etching a part of the multi-layer stack, comprising etching of at least a part of the adjustment layer, c—an annealing step to contract the adjustment layer within less than 1 nm.

A metal-semiconductor mix means either a metal-semiconductor multi-layer, or a semiconducting material matrix comprising metallic aggregates.

In particular, the semiconducting material may be silicon or germanium.

Annealing may be done under a vacuum.

This process may also comprise a phase control step by optical characterization.

A process according to the invention can contract the adjustment layer by annealing until the phase shift $\Delta\Phi$, between radiation reflected by an etched portion of the multilayer and radiation reflected by an unetched portion, is reduced for example to a value of the order of or less than 180°±5°.

Therefore the invention relates to a method of forming an optical component comprising:

a—formation of a multi-layer stack with an adjustment layer made of a metal-semiconductor mix formed in or on the stack, b—etching of a part of the multi-layer stack including at least part of the adjustment layer, c—an annealing step to reduce the phase shift ΔΦ between radiation reflected by an etched portion of the multi-layer and the radiation reflected by an unetched portion, for example to a value of the order of or less than 180°±5°.

According to one embodiment, the adjustment layer comprises a sequence of metal-Si bilayers.

The adjustment layer preferably comprises between 1 and 5 or 10 bilayers.

Preferably, the annealing step is done at a temperature of less than 200° or 300° C. or 400° C.

The invention also relates to an optical component comprising a partially etched multi-layer stack, with an adjustment layer made of a metal-semiconductor mix formed in or on the etched portion of the stack.

The phase shift angle between radiation reflected by an etched portion of the multi-layer and the radiation reflected by an unetched portion is approximately equal to or is less than 180°±5°

The adjustment layer may comprise a sequence of metal-Si bilayers, for example between 1 and 5 or 10 bilayers.

Both in the process and in the component according to the invention, the metal in the adjustment layer may for example be molybdenum or ruthenium or Rhodium (Rh) or chromium (Cr) or Palladium (Pd) or platinum (Pt) or copper (Cu) or cobalt (Co) or nickel (Ni).

The adjustment layer may also comprise barrier layers at the interfaces with the multi-layer.

For example, these barrier layers include boron carbide ($B_4C$), or carbon, or molybdenum carbide (MoC), or silicon dioxide ($SiO_2$), or molybdenum silicide ($MoSi_2$).

The adjustment layer may be located on an etching stop layer.

DETAILED PRESENTATION OF PARTICULAR EMBODIMENTS

Figure 6A:
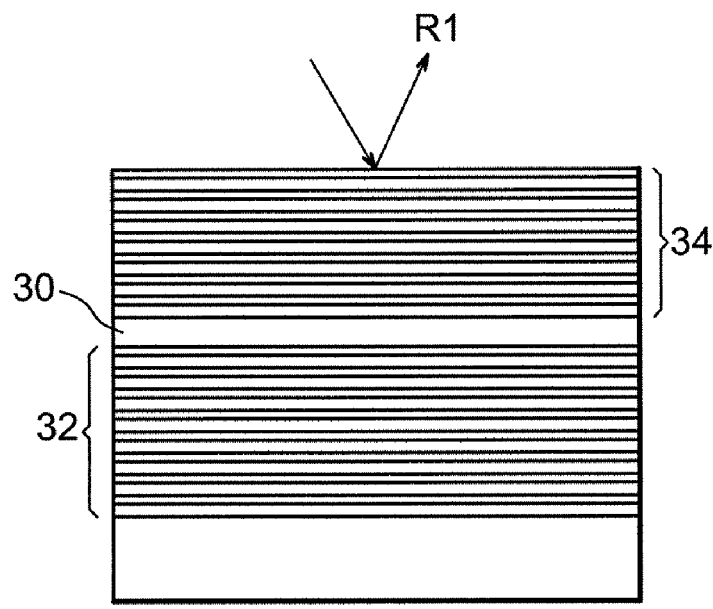
FIGS. 6A to 6C represent steps in producing a device according to the invention, FIG. 7 diagrammatically shows an example embodiment of a device according to the invention.

A first example embodiment of a device according to the invention will be described with reference to FIGS. 6A and 6B.

On FIG. 6A, an optical component, for example a mask blank, comprises an EUV reflector multi-layer stack 32, 34, for which examples of the composition will be given later, and in which an adjustment layer 30 is inserted. The thicknesses of the two parts 32 and 34 are $E_1$ and $E_2$ respectively.

The composition of this adjustment layer 30 is based on two elements, that are preferably a metal and a semiconductor, for example silicon, such that the metal and the semiconductor form an alloy by annealing.

The thickness and optical properties of this layer 30 may be adjusted by low temperature annealing. The annealing causes contraction of the layer 30 due to interdiffusion between the metal and the semiconductor in this layer. This interdiffusion also modifies the optical indexes of the layer 30, in other words its refraction index n and the extinguishing factor k.

ΔΦ is adjusted by adjusting Δε and n by annealing.

The anticipated thickness adjustment is of the order of a few fractions of nm, for example between 0.1 nm and 0.5 nm or 1 nm. Low temperature means a temperature sufficiently low to not disturb the remainder of the multi-layer, in other words so that it does not modify the reflecting properties of layers 32, 34; preferably, this temperature is less than 300° C. Advantageously, a sufficiently low temperature will be chosen so as to not modify the thickness of the layers 32, 34, and these layers may also be composed of metal/silicon bilayers as described later.

This adjustment layer is located on or above the unetched part 32 of the stack. During the adjustment process, the thickness Δε and the index n vary by contraction of the adjustment layer. Advantageously at the same time, the thicknesses $E_2$ and $E_1$ remain constant (see FIG. 6B).

The reflecting multi-layer stack 32, 34 is preferably a thermally stable, periodic structure of the $Si/Mo_2C$ or $Si/MoSi_2$ type or based on metallic layers (for example Mo or Pt) and Si, between which $B_4C$ or $SiO_2$ or $Mo_2C$ or $MoSi_2$ type barrier layers may be inserted.

These barrier layers prevent interdiffusion between metal and silicon, preventing changes to the thickness of these layers and a modification to their optical properties.

The adjustment is obtained by etching the stack, such that the phase shift added between R1 and R2 approaches the value of 180° while remaining slightly greater than 180°. This can be achieved by an in situ optical check during etching, for example using an ellipsometer or by reflectometry.

The conventional reflectometry technique also provides a means of in situ monitoring of the etching and/or contraction. For example, a source radiation in the EUV of a few nanometers, for example 4.47 nm, is sent in non-zero incidence with an intensity $I_1$ on the stack 34 (FIG. 6C), and a detector is used to monitor the reflected radiation with intensity $I'_1$.

During annealing, all that can be monitored is changes in the area containing the layer 30, which assumes that $E_2$ is not modified.

It is also possible to monitor a phase shift by differential measurement: two incident radiations with intensity $I_1$ and $I_2$ are sent respectively to the stack 34 and to the etched part, reflected radiations being $I'_1$ and $I'_2$ respectively, from which a differential measurement can be made.

Figure 3:
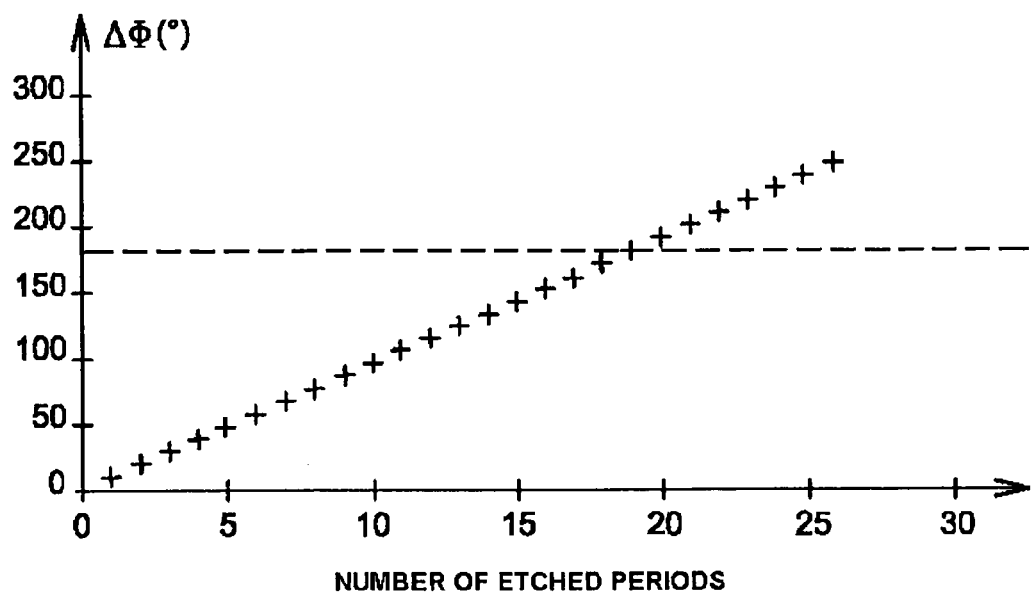
Figure 5:
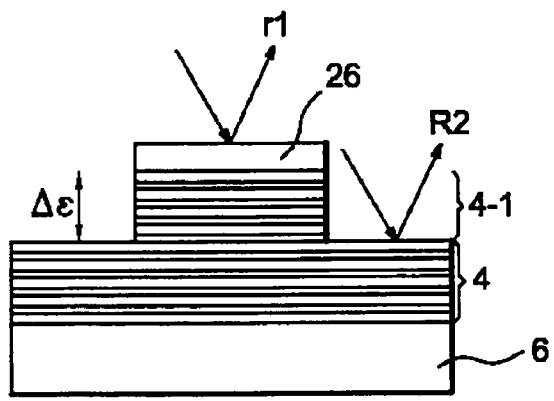

For example, in the example in FIG. 3 above, this is equivalent to etching 19 pairs of MoSi and then partially etching the $20^{th}$ pair. Either the layer 34 has exactly the required number of pairs and the layer 32 is not etched, or there are not enough pairs in the layer 34, and in this case the layer 34 and then the layer 30 are fully etched, followed by the necessary number of pairs missing in layer 32.

Figure 6B:
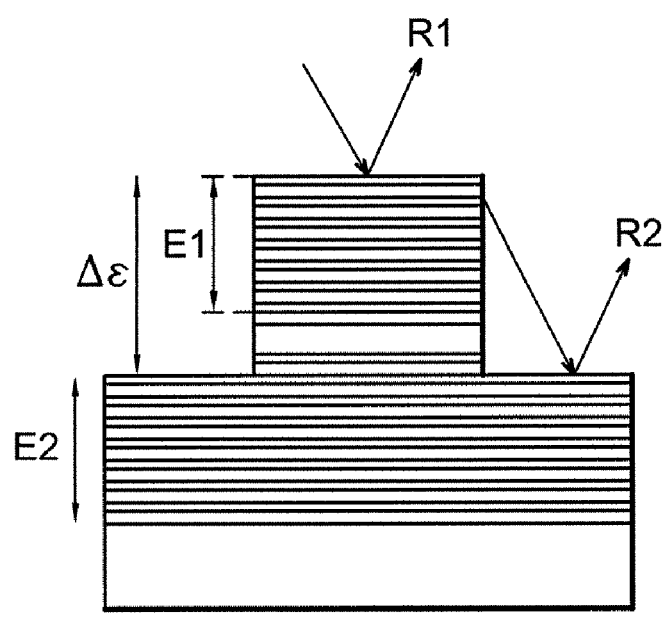
Figure 6C:
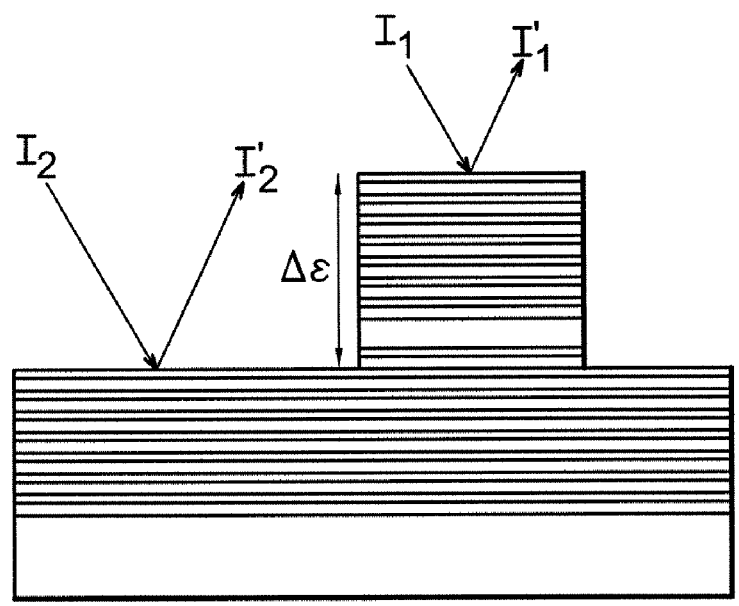

For example, this etching leads to the structure in FIG. 6B.

The next step is annealing to contract the adjustment layer 30 until the phase shift ΔΦ reduces to a value for example of the order of 180°±5°. This adjustment may be made by optical control during annealing, as described above. The advantage of this adjustment technique is that it requires a single full wafer annealing of the mask for not more than a few hours.

This annealing is preferably done under a vacuum and therefore for example may be done in the same frame as ionic etching of the multi-layer stack with phase control by in situ EUV optical characterization.

There may be a step between the etching and annealing steps to remove the resin used to define etching contours.

Therefore this full wafer annealing method does not require the use of expensive and time consuming electronic write techniques.

Therefore, the invention uses a specific adjustment layer distinct from layers 32, 34.

Figure 7:
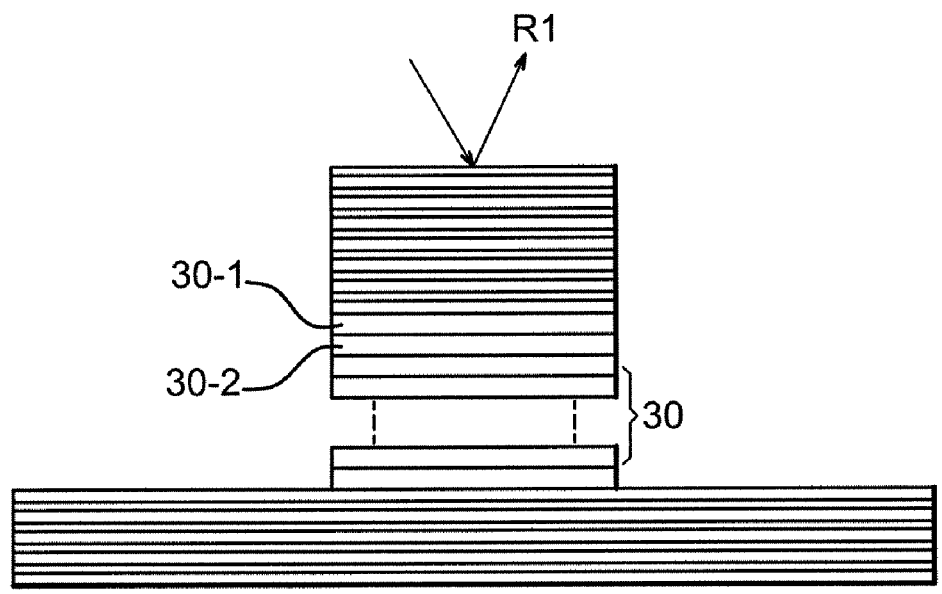

As illustrated on FIG. 7, the layer 30 may comprise silicon 30-1 into which a metal has been introduced, preferably in the form of one or several thin metallic layers 30-2.

The metal may also be in the form of aggregates.

When the metal 30-2 is deposited on the silicon 30-1, an amorphous interdiffusion zone is formed comprising a metal-silicon compound a few Angstroms or a few nanometers thick. Low temperature annealing (less than 300° C.) causes a slight growth or atomic reorganization of this interdiffusion zone.

Due to density differences between the metal, silicon and silicide that might be formed, this modification to the interface layer results in a contraction of the layer 30.

For example, in the case of the Mo—Si pair, the contraction levels given in table I below will be obtained depending on the compound formed ($Mo_3Si$ or $Mo_5Si_3$ or $MoSi_2$). The thickness values are normalized—thus, for 1 nm (or 2 nm) of Mo and 0.4 nm (or 0.8 nm) of Si, the result formed will be 1.2 nm (or 2.4 nm) of $Mo_3Si$.

TABLE I

| | Layer: compound formed | | |
|---|---|---|---|
| | $Mo_3Si$ | $Mo_5Si_3$ | $MoSi_2$ |
| Consumed thickness of Mo | 1 | 1 | 1 |
| Consumed thickness of Si | 0.4 | 0.8 | 2.5 |
| Silicide thickness formed | 1.2 | 1.4 | 2.4 |
| Concentration ratio | −14% | −22% | −31% |

Therefore, the invention uses a contraction layer 30 in which an interdiffusion phenomenon occurs between the metal and the semiconducting material, leading to a contraction of the adjustable assembly by heat treatment.

The contraction level obtained depends on the corresponding densities and concentrations of semiconducting materials in the alloys formed. Some examples are given in table II below for silicon that indicates the optical absorption coefficient K, the refraction index N, the temperature T at which a silicide is formed with silicon, the density of metal and the density of the silicide component, and finally the degree of contraction, for each metal.

TABLE II

| Material | Si | Mo | Ru | Rh | Cr | Pd | Pt | Cu | Co | Ni |
|---|---|---|---|---|---|---|---|---|---|---|
| K | 0.002 | 0.006 | 0.017 | 0.032 | 0.039 | 0.046 | 0.060 | 0.061 | 0.066 | 0.072 |
| N | 0.999 | 0.922 | 0.889 | 0.873 | 0.931 | 0.877 | 0.891 | 0.963 | 0.933 | 0.948 |
| Compound (T° C.)* | — | $MoSi_2$ 420° C. | $Ru_2Si_3$ 350° C. | RhSi 350° C. | $CrSi_2$ 520° C. | $Pd_2Si$ 175° C. | $Pt_2Si$ 250° C. | $Cu_3Si$ 150° C. | $CoSi2$ 350° C. | $Ni_2Si$ |
| Metal density | — | 10.2 | 12.2 | 12.4 | 7.19 | 12 | 21.4 | 8.96 | 8.9 | 8.9 |
| Density** of compound/ contraction | — | 6.24/ −31% | | 8.3/ −22% | 4.9/ −29% | | | | 5.3/ −29% | 7.2/ −20% |

*typical value measured in thin layer
**known values for solid materials

For example, the «Mo» column is read as follows: annealing of an Mo/Si mix at 420° C. forms $MoSi_2$, the thickness of this layer of $MoSi_2$ corresponding to the sum of the initial thicknesses of Me and Si×0.69:

$$e_{MoSi2} = (e_{Mo} + e_{Si}) \times 0.69.$$

In the case of the Mo—Si pair, experimental data show that at constant temperature, the annealing time can control the reduction in thickness due to contraction with very good precision, less than one Angstrom at very low temperature (see example 1 below).

Preferably, the adjustable layer 30, for example based on Mo and Si in the form of a bilayer or multi-layer, comprises barrier layers 50 at the interface with layers 32 and 34 (with composition $B_4C$ or C or MoC or $SiO_2$ or $MoSi_2$ etc.) to prevent interdiffusion phenomena between the layers 30 and the layers 32, 34.

Ruthenium (Ru) may also be used as a replacement of molybdenum in the layer 30.

Table II thus shows that this element Ru, while keeping a reasonable optical absorption (k=0.017) compared with Mo, forms a compound defined with Si at a relatively low temperature, and also creates a contraction phenomenon.

Adjustable layers preferably have a quarter wave thickness (e=λ/4n) to contribute to increasing the reflection R1 in the upper part 34 of the multi-layer.

This is possible particularly in the case of metals Mo and Ru that have a low optical transparency and index compared with Si.

Figure 8:
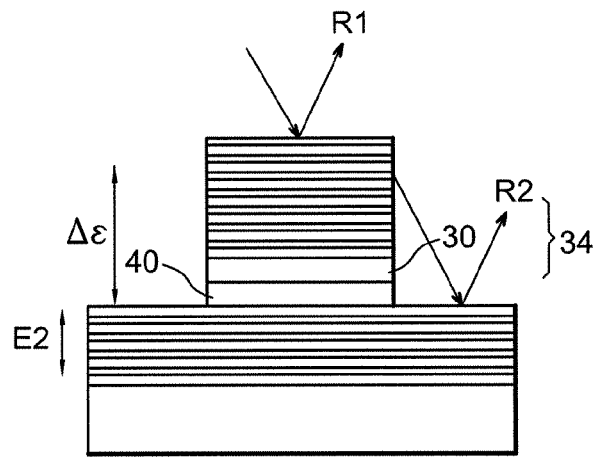
FIG. 8 is a variant of a device according to this invention.

The adapter layer 30 is preferably located just above an etching stop layer 40 as indicated on FIG. 8.

Furthermore, to maintain a high adjustment precision with a resolution of a few tenths of an Angstrom and also to limit the impact of this layer 30 on the optical function Ri, the layer 30 preferably comprises a limited number of bilayers, for example between 1 and 5 or 10.

To further reduce the adjustment temperature, metals can be used for the layer 30 to form silicides with silicon at very low temperature.

In this case, the mirror function may be maintained by an unstable multi-layer 32, 34, although a thermally stable multi-layer is always preferable.

For example, the layer 30 is made of Pd/Si and the layers 32, 34 are made of Mo/Si. Annealing is done at a temperature approximately equal to or greater than 175° C. $Pd_2Si$ is formed at 175° C., whereas the Mo—Si pair remains stable at this temperature ($MoSi_2$ only forming starting from 420° C., see table II).

Table II shows that the metals Pd, Ni, Pt and Cu are good candidates, non-exhaustively and in order of preference. Mo and Ru are good candidates for attenuated phase shift masks. Co and Rh can also be used but preferably with a stabilized mirror.

Like chromium, often used in EUV absorbers, all these metals are relatively absorbent (unlike Mo and Ru that are relatively transparent).

Figure 4:
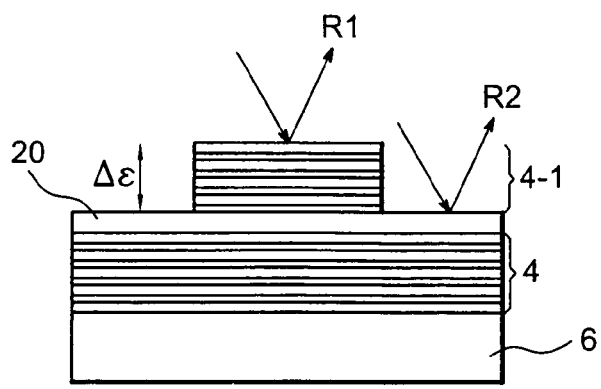
Figure 9:
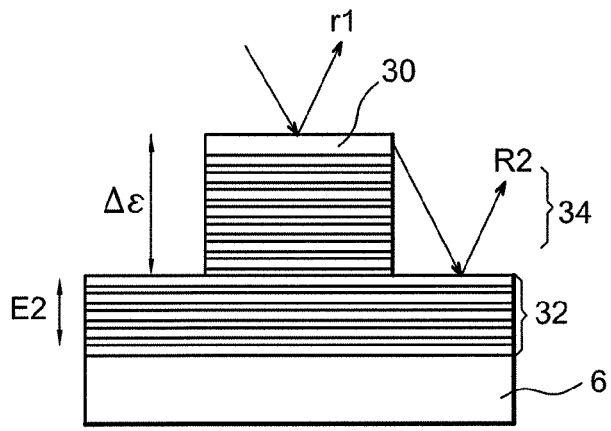
FIG. 9 shows another variant in which the adjustment layer also forms an absorbent contrast improvement layer.

In this case, in addition to its adjustment role, the layer 30 may be used directly as an upper absorbent layer (FIG. 9) or in association with a pre-existing absorbent layer (in this case this absorbent layer is also located at the top of the stack 34). The structure of FIG. 9 may also comprise a standard etching stop layer like that described in FIG. 4 (at the same location, in other words at the bottom of portion 34).

In the case of structures with attenuated phase shift masks, it would also be possible to use the germanium than the silicon. Germanium is absorbent in EUV. Therefore its use reinforces EUV optical absorption of the adjustment layer.

We will now describe example embodiments.

Example 1: in this first example, the adjustment layer 30 is an Mo—Si bilayer.

It typically comprises 3 nm of Mo deposited on 4 nm of Si. This layer is inserted in a stable multi-layer (with $B_4C$ type barrier layers) comprising 40 to 50 Mo/Si bilayers with a period of 7 nm.

The adjustment layer 30 is preferably placed immediately above the etching stop layer 40 (structure in FIG. 8) to reduce its impact on the value of R1.

Figure 10A:
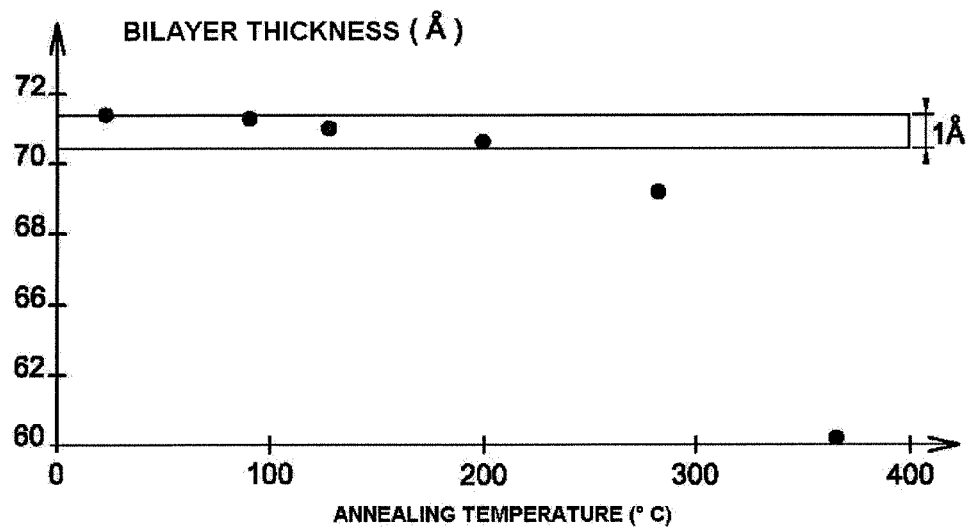
FIGS. 10A and 10B represent curves showing adjustments to the thickness of an Mo/Si bilayer as a function of the temperature and/or time
Figure 10B:
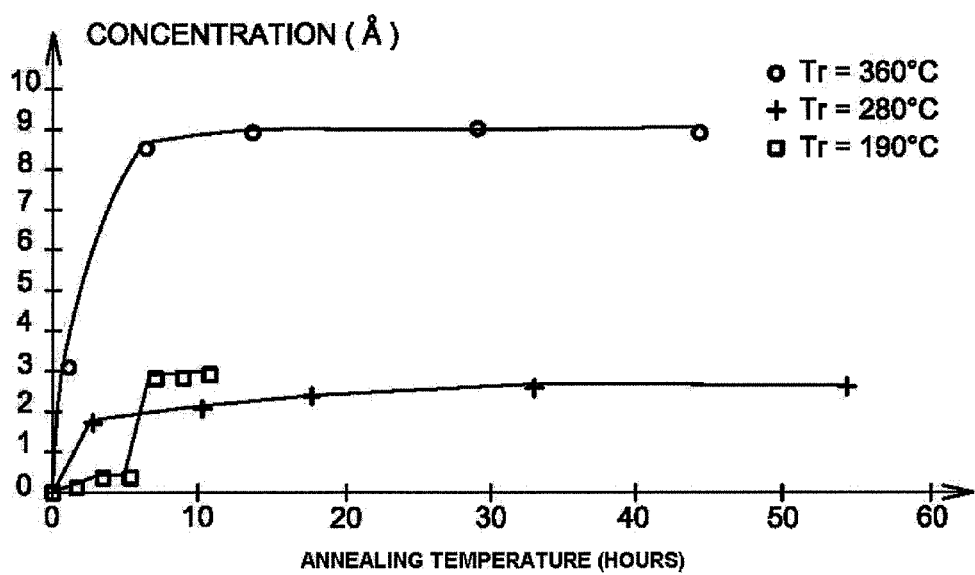
Figure 12:
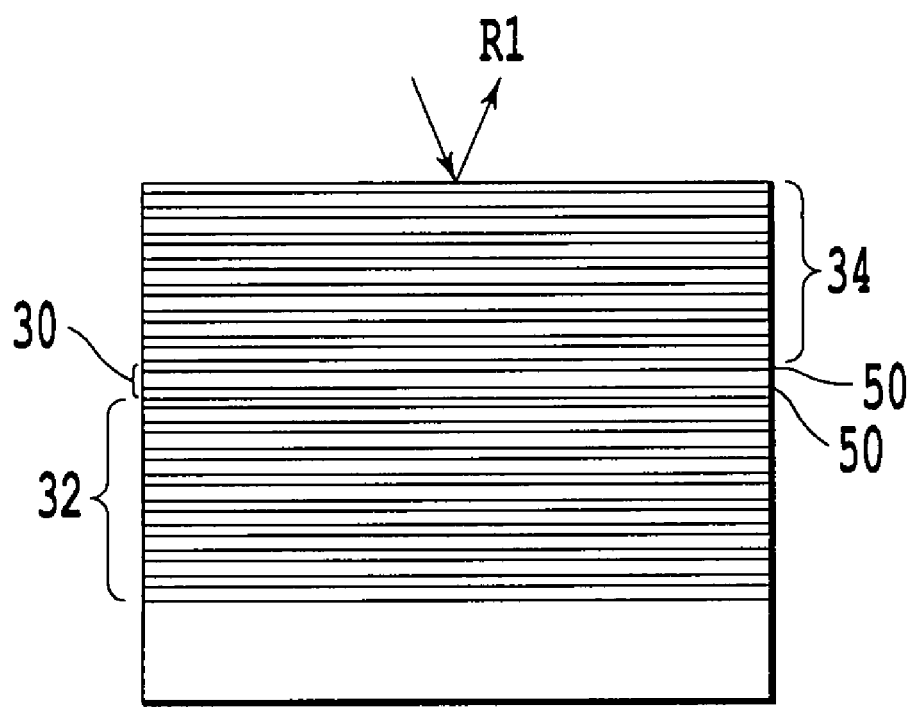
FIG. 12 shows another example of a device according to the invention where the adjustment layer comprises a barrier layer at each interface with the remainder of the multi-layer stack.

The variation of thickness of this layer is given as a function of the temperature and as a function of time on FIGS. 10A and 10B.

FIG. 10A shows variations in the thickness of the Mo/Si bilayer by accumulated successive annealings. Each annealing is done under a vacuum for 16 hours. Starting from an initial thickness of about 7 nm, the result is a final thickness of approximately 6 nm, with a variation of almost 1 nm.

FIG. 10B indicates variations (contractions) in the thickness of the Mo/Si bilayer by vacuum annealing at constant temperature and increasing time.

For a constant annealing time, the contraction depends on the annealing temperature. In the example given in FIG. 10A, it can be seen that thickness of the bilayer 30 can be adjusted within a precision range of less than 1 Å, for temperatures not exceeding 200° C.

Similarly, contraction of an Mo—Si bilayer increases with the annealing time. It can be observed that contraction of the bilayer can be controlled within a few tenths of an Angstrom by annealing at 190° C., within the 1 to 2 Å range by annealing at 280° C., and up to 1 nm by annealing at 360° C.

Furthermore, these annealings are cumulative: when the sample annealed at 190° C. is annealed at 360° C. (grey points on the Tr=190° C. curve), it follows a contraction curve parallel to the curve for the sample annealed directly at 360° C. (curve Tr=360° C.).

Figure 1:
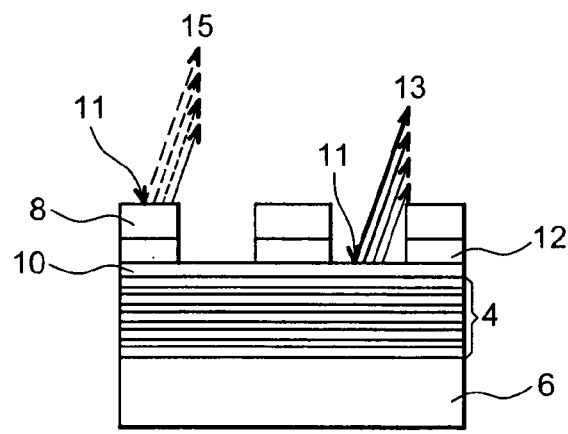
FIGS. 1 to 5 show various devices according to prior art, FIG. 4 representing an example of changes to the phase shift as a function of the number of etched periods.
Figure 2:
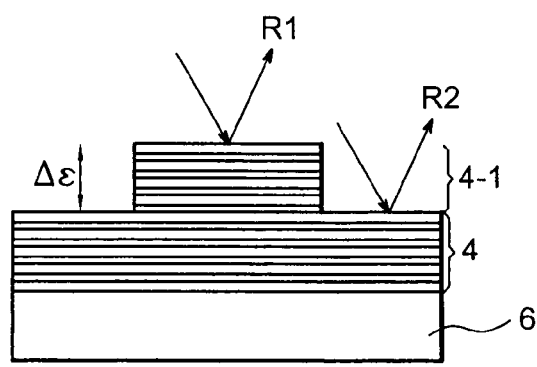

Example 2: the adjustment layer 30 comprises a bilayer pair Mo—Si, each bilayer comprising a 2 nm layer of Si and a 1.5 nm layer of Mo. Other parameters are identical to the parameters in example 1. The advantage is that in this case, there are two interdiffusion zones Mo—Si, therefore a double contraction effect in comparison with FIG. 1, all other things being equal.

Example 3: the adjustment layer 30 is a mix of Mo and Si obtained by co-sputtering or co-evaporation of molybdenum and silicon; the deposition rates are adjusted so as to deposit twice much as Si as Mo: the result is thus a composite material comprising either a single phase of amorphous $MoSi_2$, or a phase of amorphous Si with Mo aggregates, or both at the same time. An appropriate annealing will cause contraction of the adjustment layer by homogenising this layer of amorphous $MoSi_2$.

Example 4: this example is exactly the same as examples 1 or 2, except that Mo is replaced by Ru in the stack 30. The advantage is that diffusion of Si in Ru takes place at a lower temperature than in Mo (see table II). The adjustment by annealing is made under less restrictive conditions for the multi-layer mirror function 32, 34.

Figure 11:
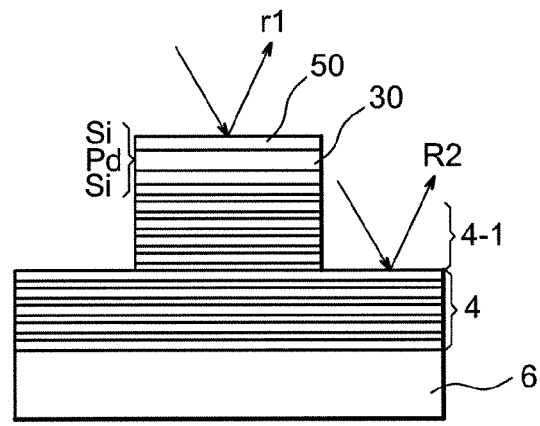
FIG. 11 shows another example of a device according to the invention with an absorbent layer deposited on the surface of a multi-layer.

Example 5: the absorbent adjustment layer 30 deposited on the surface of the Mo—Si multi-layer (structure in FIG. 11) comprises a multi-layer (3 nm Pd+4 nm Si) with p Pd—Si pairs, encapsulated by silicon 50 on the surface.

The next step is an attenuated mask adjustable at a very low temperature of about 100° C., that can use a classical or stabilized multi-layer stack 32, 34 (Mo—Si). This structure is probably the simplest to use. The number of pairs in the adjustment layer 30 will depend on the required optical attenuation and the required thickness variation range.

The structure of the mask blank according to the invention can be used to:
- make phase shift masks for EUV lithography, for which the phase is adjustable by simple full wafer annealing at low temperature (T<300° C.) in a controlled environment (with or without vacuum),
- adjust the change in thickness, and therefore the optical phase shift, between the etched and unetched parts of a mask with a resolution of better than one Angstrom (or of the order of a degree in term of phase shift),
- to make this adjustment with a precision of the order of one Angstrom without any degradation to the optical function of the multi-layer mirror 32, 34,
- to be able to make this adjustment under a vacuum directly following etching (after removal of the resin).

The invention can be used in various domains in industrial applications, for example EUV lithography, manufacturing of mask blanks, manufacturing of masks or production of the EUV optical components, particularly requiring a precise phase adjustment (polarisers, etc.), or manufacturing of etched structures (gratings, buried patterns, etc.), requiring a precise dimensional adjustment.

The invention claimed is:

1. A process for forming an optical component, the process comprising
forming a multi-layer stack having a reflecting zone and an adjustment layer made of a metal-semiconductor mix formed within or on top of the multi-layer stack;
etching at least one region of the multi-layer stack to remove at least a part of the adjustment layer in the etched region(s); and
annealing the multi-layer stack to contract the remaining adjustment layer within less than 1 nm, wherein
the annealing does not modify the reflecting properties of the reflecting zone of the multi-layer stack; and
the annealing does modify the reflecting properties of the multi-layer stack.

2. The process according to claim 1, wherein the annealing is done under a vacuum.

3. The process according to claim 1, also comprising monitoring radiation reflected by an unetched part of the multi-layer stack.

4. The process according to claim 1, also comprising monitoring a phase shift between radiation reflected by an unetched portion of the etched part of the multi-layer stack and radiation reflected by an unetched part of the multi-layer stack.

5. The process according to claim 1, wherein the adjustment layer comprises a sequence of metal-semiconductor bilayers.

6. The process according to claim 1, wherein the adjustment layer comprises a semiconducting material matrix comprising metallic aggregates.

7. The process according to claim 5, wherein the adjustment layer comprises between 1 and 10 bilayers.

8. The process according to claim 1, wherein the adjustment layer is formed within the multi-layer stack;
the adjustment layer comprises a barrier layer at each interface with the multi-layer stack; and
each barrier layer has the same composition.

9. The process according to claim 8, wherein the barrier layer includes boron carbide ($B_4C$), or carbon, or molybdenum carbide (MoC), or silicon dioxide ($SiO_2$), or molybdenum silicide ($MoSi_2$).

10. The process according to claim 1, wherein the adjustment layer is located on an etching stop layer.

11. The process according to claim 1, wherein the adjustment layer is located on the unetched part of the multi-layer stack.

12. The process according to claim 11, wherein the semiconductor is germanium.

13. The process according to claim 11, wherein the metal is rhodium (Rh) or palladium (Pd) or platinum (Pt) or nickel (Ni) or copper (Cu) or cobalt (Co).

14. The process according to claim 1, wherein the semiconductor is silicon.

15. The process according to claim 1, wherein the metal is molybdenum or ruthenium.

16. The process according to claim 1, wherein the annealing is done at a temperature less than 400° C.

17. The process according to claim 1, wherein the annealing does not modify the thickness of the reflecting zone.

18. A process for forming an optical component, the process comprising
forming a multi-layer stack having a reflecting zone and an adjustment layer made of a metal-semiconductor mix formed within the multi-layer stack;
etching at least one region of the multi-layer stack to remove at least a part of the adjustment layer in the etched region(s); and
annealing the multi-layer stack to contract the remaining adjustment layer within less than 1 nm, wherein
the annealing does not modify the reflecting properties of the reflecting zone of the multi-layer stack; and
the annealing does modify the reflecting properties of the multi-layer stack.

19. The process according to claim 18, wherein the adjustment layer comprises a barrier layer at each interface with the multi-layer stack.

20. The process according to claim 19, wherein each barrier layer has the same composition.

* * * * *